United States Patent
Wada

(10) Patent No.: US 7,866,518 B2
(45) Date of Patent: Jan. 11, 2011

(54) TAPE FEEDER, TAPE CARRYING UNIT AND TAPE EXFOLIATING UNIT

(75) Inventor: Akifumi Wada, Fukuoka (JP)

(73) Assignee: Panasonic Corporation, Osaka (JP)

( * ) Notice: Subject to any disclaimer, the term of this patent is extended or adjusted under 35 U.S.C. 154(b) by 224 days.

(21) Appl. No.: 12/043,536

(22) Filed: Mar. 6, 2008

(65) Prior Publication Data

US 2008/0217459 A1 Sep. 11, 2008

(30) Foreign Application Priority Data

Mar. 9, 2007 (JP) .............................. 2007-059421

(51) Int. Cl.
*B65H 20/00* (2006.01)
*B65B 21/02* (2006.01)

(52) U.S. Cl. .................. 226/128; 226/129; 414/416.05; 414/411

(58) Field of Classification Search .................. 226/128, 226/129, 139, 157; 414/411, 416.05, 416.06, 414/806, 810

See application file for complete search history.

(56) References Cited

U.S. PATENT DOCUMENTS

| | | | | |
|---|---|---|---|---|
| 6,196,783 B1* | 3/2001 | Foster | .................... | 414/416.01 |
| 6,318,437 B1* | 11/2001 | Yoo et al. | .................... | 156/584 |
| 6,695,032 B2* | 2/2004 | Kim | ............................ | 156/582 |
| 7,052,564 B2* | 5/2006 | Tandle et al. | .................... | 156/64 |
| 7,220,095 B2* | 5/2007 | Lyndaker et al. | ............. | 414/810 |
| 2003/0219330 A1* | 11/2003 | Lyndaker et al. | ............. | 414/411 |
| 2007/0034314 A1* | 2/2007 | Tandle et al. | .................... | 156/64 |

FOREIGN PATENT DOCUMENTS

| | | |
|---|---|---|
| JP | 04-076997 A | 3/1992 |
| JP | 10-079600 A | 3/1998 |
| JP | 3873738 | 11/2006 |

OTHER PUBLICATIONS

Japanese Office Action.

* cited by examiner

*Primary Examiner*—Evan H Langdon
(74) *Attorney, Agent, or Firm*—Pearne & Gordon LLP

(57) ABSTRACT

A tape feeder 1 includes a carrying sprocket 4 for carrying a carrier tape 3 at inside of a cabinet 2, a motor 5 for driving to rotate the carrying sprocket 4, a driven sprocket 6 driven to rotate by a movement of the carrier tape 3 carried at inside of the cabinet 2, and an exfoliating roller 7 rotated cooperatively with rotation of the driven sprocket 6 for reeling to exfoliate a cover tape 12 pasted onto the carrier tape 3 for sealing a part, in which driving of the motor 5 is transmitted as an operation of carrying the carrier tape 3 and is transmitted to the driven sprocket 6 by way of the carrier tape 3.

7 Claims, 5 Drawing Sheets

TAPE FEEDER, TAPE CARRYING UNIT AND TAPE EXFOLIATING UNIT

BACKGROUND OF THE INVENTION

The present invention relates to a tape feeder for supplying a part contained in a tape in a state of capable of picking up the part.

According to a carrier tape used in a tape feeder, parts are contained at part containing portions formed at equal intervals in a carrying direction, and opening portions thereof are covered by a cover tape. Sprocket holes are formed at equal intervals in parallel with the part containing portions, and when a carrying sprocket is intermittently rotated in a state of being brought in mesh with the sprocket holes, the carrier tape is carried in one direction by a constant pitch. Thereby, the parts contained in the part containing portions are successively supplied to a pick up position, picked up by a nozzle or the like of a mounting head and mounted to a board or the like. In picking up by a nozzle or the like, it is necessary to expose the part by exfoliating the cover tape, and therefore, there is used a tape feeder including an exfoliating mechanism of the cover tape other than a carrying mechanism of the carrier tape (refer to Patent Reference 1).

[Patent Reference 1] Japanese Patent No. 3873738

The carrying mechanism and the exfoliating mechanism are constituted by drive systems independent from each other, and parts in an exposed state are controlled to be successively supplied to the pick up position by synchronizing the drive systems. However, the tape feeder including the two drive systems is expensive, and it is difficult in view of cost to previously prepare spares exceeding a number of pieces necessary for shortening time taken for interchanging a carrier tape. In this case, although a reduction in cost can be achieved by commonly using a single drive system by linking the drive system of the carrying mechanism and the exfoliating mechanism, there poses a problem that a total mechanism is complicated and layout is restricted by a restriction in view of a link mechanism.

SUMMARY OF THE INVENTION

Hence, it is an object of the invention to provide a tape feeder which does not complicate a mechanism by sharing a single drive system for carrying a carrier tape and exfoliating a cover tape.

According to the invention, a tape feeder includes a carrying sprocket made to be rotatable in a state of being brought in mesh with a sprocket hole formed at a carrier tape, driving means for driving to rotate the carrying sprocket, a driven sprocket rotated by being brought in mesh with the sprocket hole of the carrier tape carried in one direction by being driven to rotate by the carrying sprocket, and an exfoliating roller rotated cooperatively with the driven sprocket for reeling to exfoliate a cover tape pasted onto the carrier tape for sealing a part.

Preferably, a second unit constituted by the driven sprocket and the exfoliating roller and a carry path of the carrier tape is made to be attachable and detachable to and from a first unit constituted by the carrying sprocket and the driving means, and when the second unit is mounted to the first unit, the carrying sprocket is brought in mesh with the sprocket hole of the carrier tape.

Preferably, the carrying sprocket is brought in mesh with the sprocket hole from a lower side of the carrier tape and the driven sprocket is brought in mesh with the sprocket hole from an upper side of the carrier tape.

Further, the tape feeder further includes restricting means for restricting the carrier tape from being moved in a state of separating the second unit and the first unit.

According to the invention, the carrier tape can be carried and the cover tape can be exfoliated by the single drive system without using a link mechanism, and therefore, the carrier feeder can be fabricated by comparatively inexpensive cost, a total mechanism is simplified and a degree of freedom of an apparatus layout is promoted.

DETAILED DESCRIPTION OF THE PREFERRED EMBODIMENTS

Figure 1:
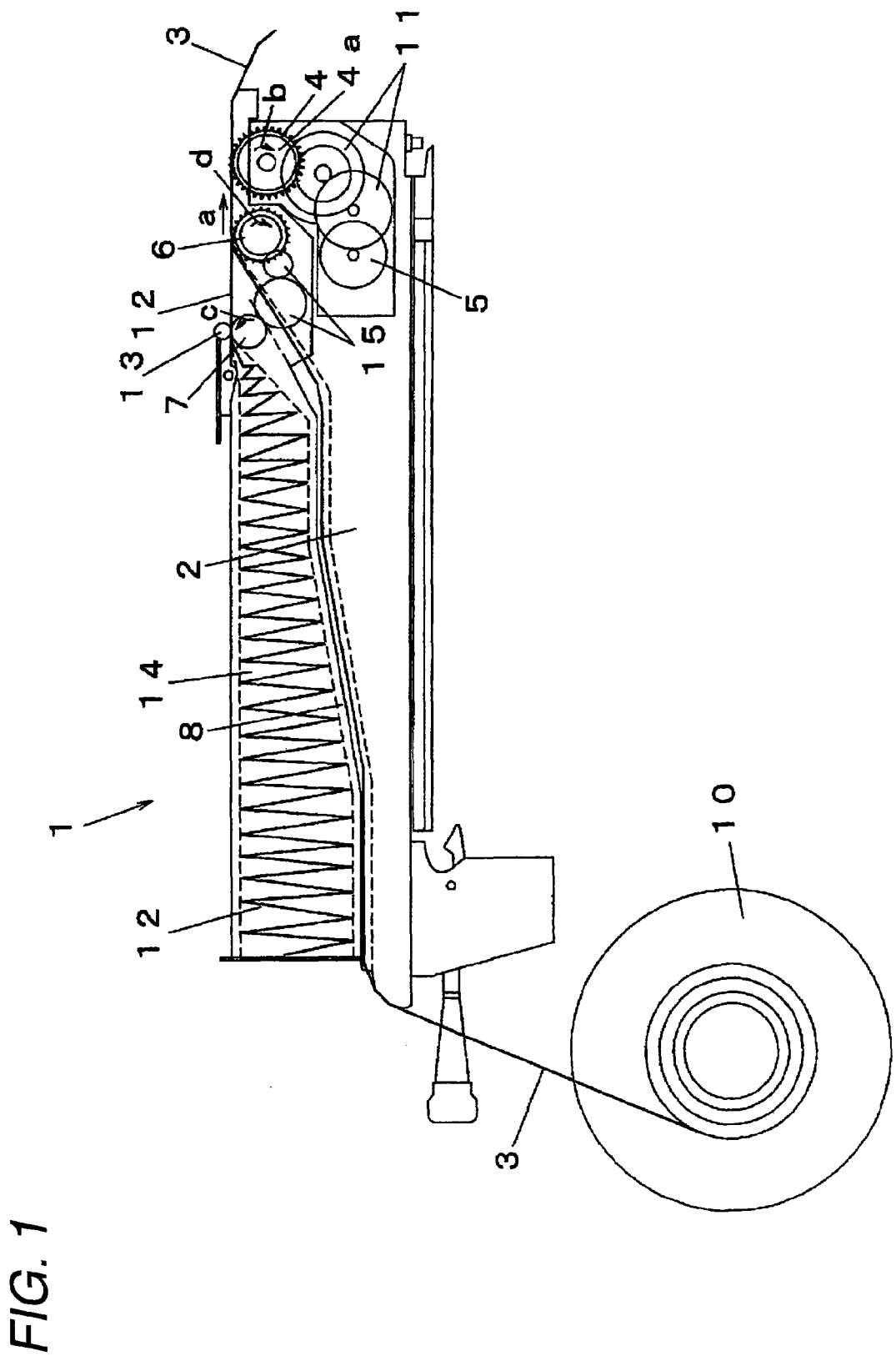
FIG. 1 is a side view of a tape feeder according to an embodiment of the invention.

In FIG. 1, a tape feeder 1 is mainly constituted by a carrying sprocket 4 for carrying a carrier tape 3 at inside of a cabinet 2, a motor 5 for driving to rotate the carrying sprocket 4, a driven sprocket 6 driven to be rotated by a movement of the carrier tape 3 carried at inside of the cabinet 2, and an exfoliating roller 7 rotated cooperatively with rotation of the driven sprocket 6. The carrier tape 3 is reeled to a reel 10 on an outer side of the cabinet 2 and carried from a rear portion to a front portion (arrow mark a) along a carry path 8 formed on an inner side of the cabinet 2 and is surfaced to an upper portion of the cabinet 2 at a section of a portion of the front portion. Further, in the explanation, assume that the carrier tape 3 is carried from an upstream side to a downstream side and assume that a side of the rear portion of the cabinet 2 is the upstream side and a side of the front portion is the downstream side.

The carrying sprocket 4 is arranged such that an upper portion thereof is brought in mesh with a sprocket hole of the carrier tape 3 surfaced to the upper portion of the cabinet 2. The motor 5 constituting driving means of the carrying sprocket 4 transmits a rotation drive force to the carrying sprocket 4 by way of a plurality of middle gears 11. Therefore, when the motor 5 is driven, the carrying sprocket 4 is rotated (arrow mark b) and the carrier tape 3 is carried while changing a portion thereof brought in mesh with the carrying sprocket 4 from the upstream side to the downstream side (arrow mark a).

Figure 2A:
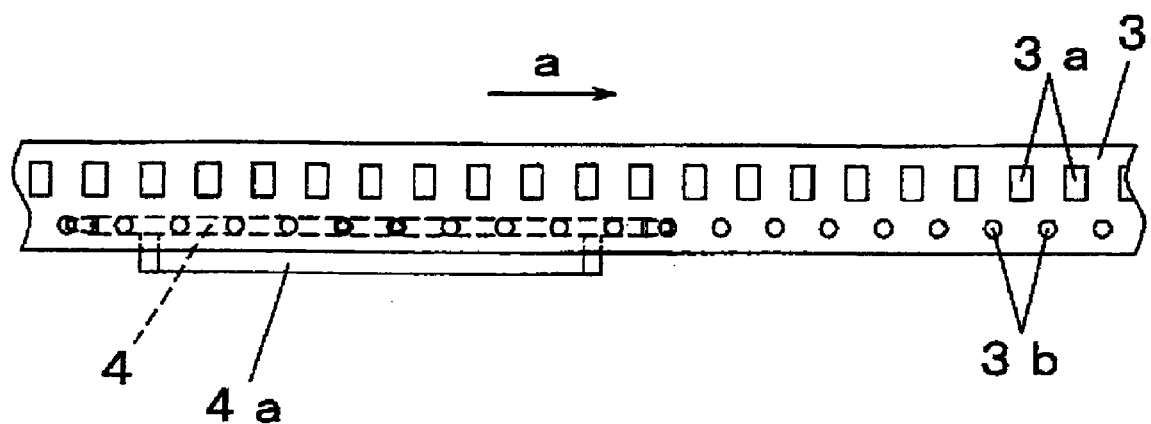
FIG. 2 illustrates views of arranging a carrier tape and a carrying sprocket in the tape feeder according to the embodiment of the invention.
Figure 2B:
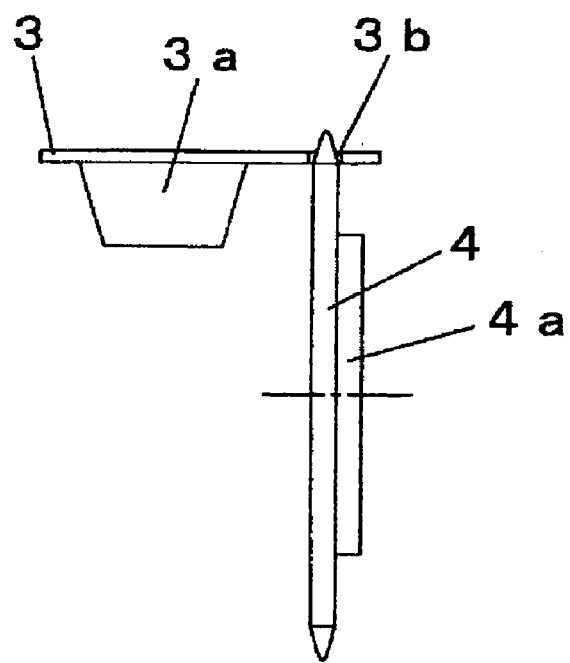

As shown by FIG. 2(a), the carrier tape 3 is formed with part containing portions 3a at equal intervals in a carrying direction (arrow mark a), and sprocket holes 3b are formed at equal intervals in parallel with the part containing portion 3a. Although as shown by FIG. 2(b), a portion formed with the sprocket hole 3b is made to be comparatively thin, a depth of the part containing portion 3a is determined by a size of a part, and therefore, the carrier tape 3 containing a large-sized part tends to be thickened. Therefore, a gear 4a of the carrying sprocket 4 brought in mesh with the middle gear 11 is arranged on a side which is not a side of the part containing portion 3a in two sides of the carrying sprocket 4 so as not to interfere with the part containing portion 3a.

The exfoliating roller 7 is provided with a function of exfoliating a cover tape 12 pasted onto an upper face of the carrier tape 3 for sealing a part in a procedure of carrying the carrier tape 3 and exposing the part contained in the carrier tape 3 to outside. The exfoliating roller 7 is arranged on the downstream side of the carrying sprocket 4 along with an opposed exfoliating roller 13, rotated (arrow mark c) in a state of pinching the cover tape 12 at a portion thereof brought into contact with the opposed exfoliating roller 13, and reels the cover tape 12 from the downstream side to the upstream side to exfoliate from the upper face of the carrier tape 3. The reeled cover tape 12 is temporarily stored at a cover tape containing portion 14 at inside of the cabinet 2.

The driven sprocket 6 is arranged on the downstream side of the carrying sprocket 4 such that an upper portion thereof is brought in mesh with the sprocket hole of the carrier tape 3. The driven sprocket 6 is driven to rotate (arrow mark d) by the-movement of the carrier tape 3 carried from the upstream side to the downstream side, and transmits a rotation drive force to the exfoliating roller 7 by way of a middle gear 15.

Figure 3:
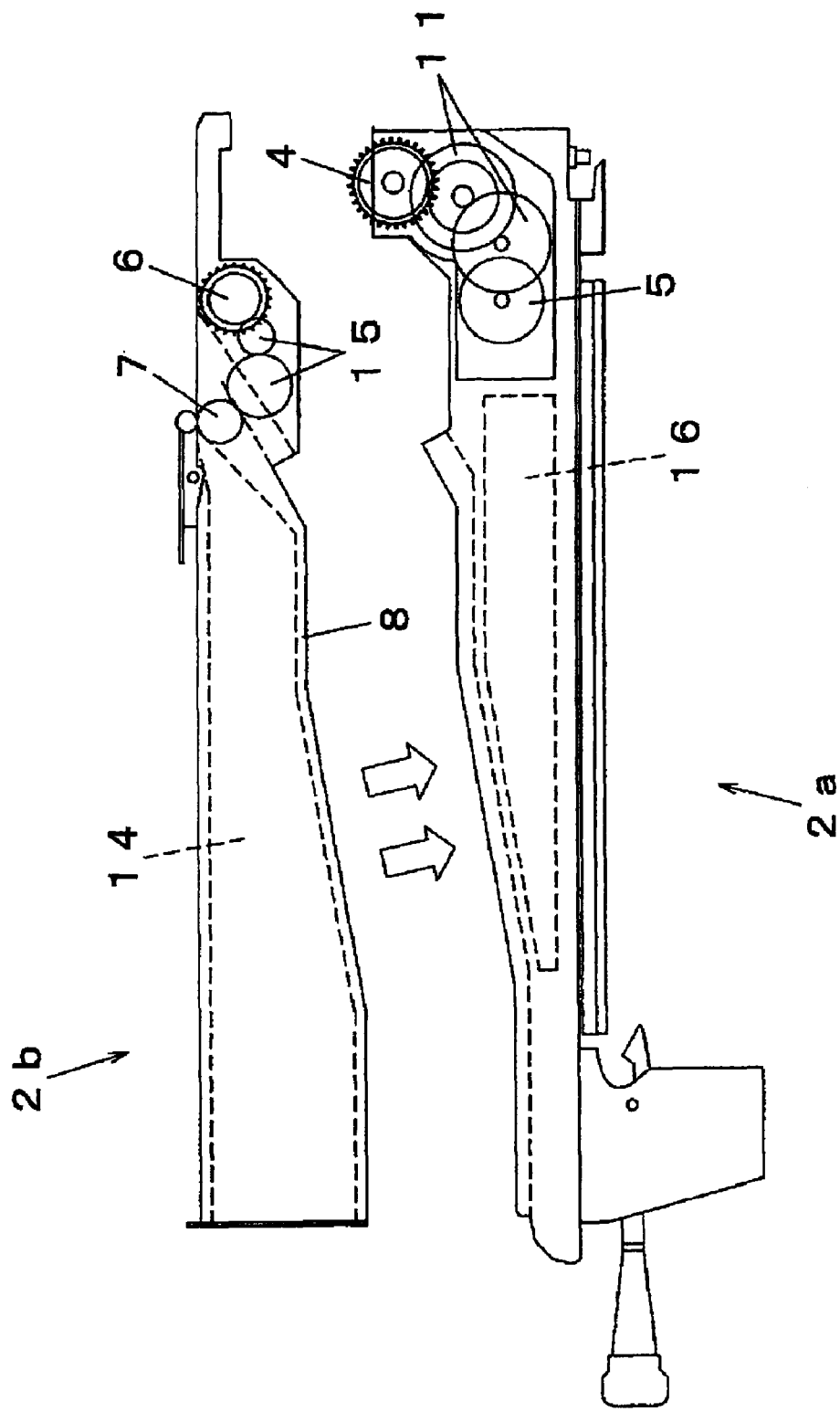
FIG. 3 is a side view showing a state of attaching and detaching a first unit and a second unit constituting the tape feeder of the embodiment of the invention.
Figure 4A:
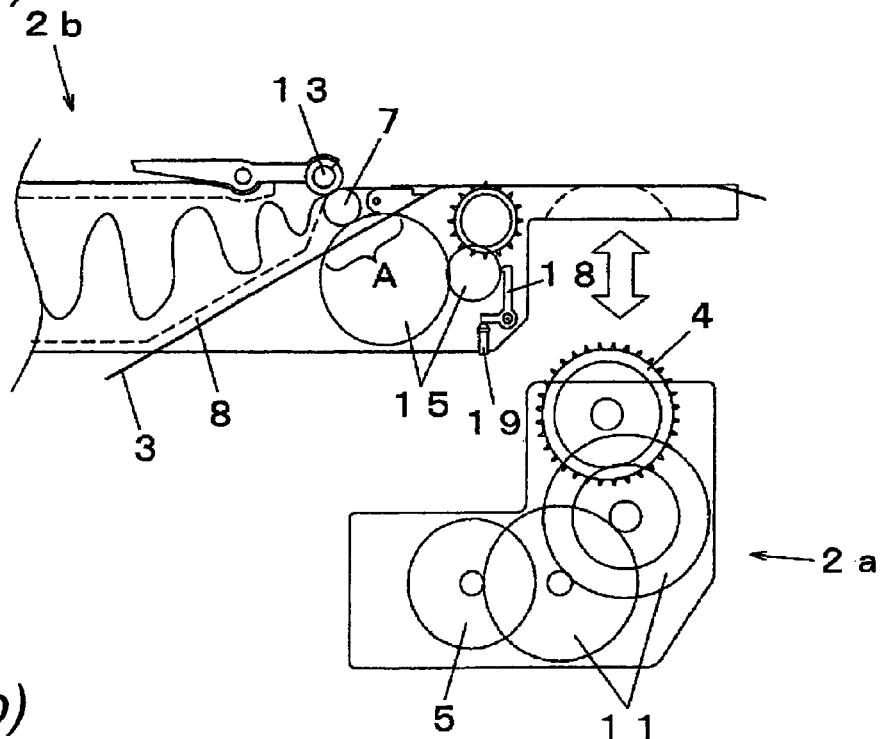
FIG. 4 illustrates side views showing a state of attaching and detaching the first unit and the second unit constituting the tape feeder of the embodiment of the invention.

In FIG. 3, the cabinet is constituted by a first unit 2a and a second unit 2b which are dividable. The first unit 2a constituting a tape carrying unit includes the carrying sprocket 4 and the middle gear 11, the motor 5 and a driver unit 16 for controlling to drive the motor 5. The second unit 2b constituting a tape exfoliating unit includes the driven sprocket 6 and the exfoliating roller 7, the middle gear 15, the carry path 8, and the cover tape containing portion 14. The second unit 2b is made to be attachable and detachable to an from the first unit 2a, and as shown by FIGS. 4(a)(b), when the second unit 2b is mounted to the first unit 2a in a state of arranging the carrier tape 3 at the carry path 8, the carrying sprocket 4 is brought in mesh with the sprocket hole 3b of the carrier tape 3 (refer to FIG. 2). Here, an upper face of the first unit 2a is made to function as a tape exfoliating unit mounting portion mounted with the second unit 2b. Particularly, a portion of the upper face of the first unit 2a immediately rearward from the carrying sprocket 4 is made to function as a driven sprocket containing portion for containing the driven sprocket 6. Further, a portion of the second unit 2b forward from the driven sprocket 6 is made to function as a cover portion for covering an upper side of the carrying sprocket 4. Further, there is provided an opening portion (not illustrated) on an upper face of the second unit 2b and between the carrying sprocket 4 and the driven sprocket 6 for picking up a part contained at the part containing portion 3a by a shifting mount head 17.

Figure 4B:
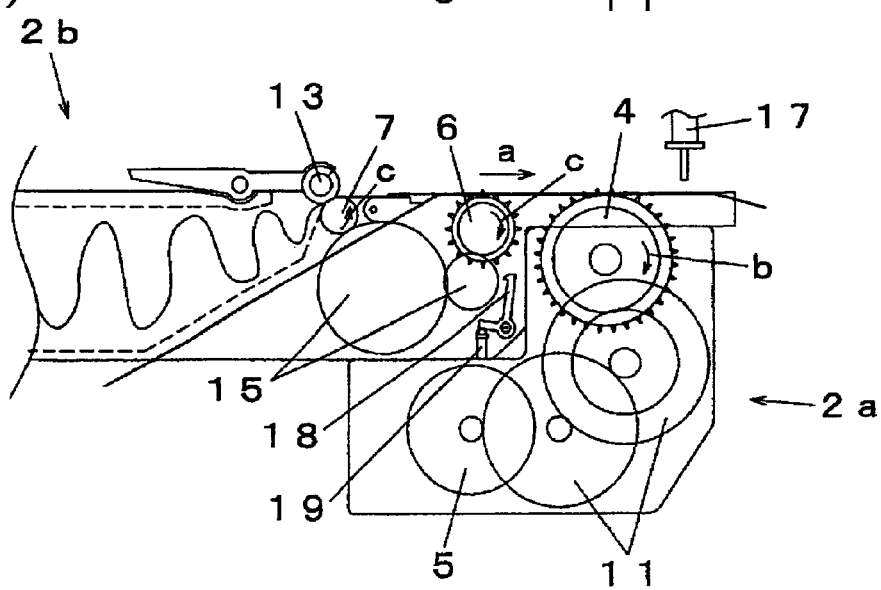

When the motor 5 is driven in a mounting state shown in FIG. 4(b), the carrying sprocket 4 is rotated (arrow mark b) and the carrier tape 3 is carried from the upstream side to the downstream side (arrow mark a). The driven sprocket 6 is rotated (arrow mark d) in accordance with the movement of the carrier tape, the exfoliating roller is rotated (arrow mark c) cooperatively therewith, and the cover tape 12 is exfoliated. Thereby, the part contained at the carrier tape 3 is brought into an exposed state and can be picked up by the nozzle on the upstream side of the carrying sprocket 4.

The second unit 2b is arranged with a stopper 18 as restricting means for restricting a position of the carrier tape 3 in a separated state shown in FIG. 4(a). The stopper 18 is constructed by a constitution of capable of being moved to a position to be engaged with the middle gear 15 and a position to release the engagement, and is brought into a state of being urged to the position to be engaged with the middle gear 15 when the second unit 2b is separated. By restricting rotation of the middle gear 15 under the state, the carrier tape 3 is made to be unable to move to be brought into a state of restricting a position thereof. The stopper 18 is also provided with a switch 19 for releasing an urged state, and the stopper 18 is moved to a position of releasing the engagement with the middle gear 15 by changing a position of the switch 19. The switch 19 is arranged at a position of interfering with the first unit 2a in mounting the second unit 2b, and in FIG. 4(b), when the second unit 2b is mounted to the first unit 2a, the urged state of the stopper 18 is released by changing the position. Thereby, in a state of mounting the second unit 2b, the urged state of the stopper 18 is automatically released and the carrier tape 3 is brought into a state of being able to be carried.

The tape feeder 1 constituted in this way achieves an advantage of being able to be fabricated by comparatively inexpensive cost since the carrier tape 3 is carried and the cover tape 12 is exfoliated by a single drive system constituting a drive source by the single motor 5. Further, the carried carrier tape 3 per se is moved cooperatively with the exfoliating operation, and therefore, in comparison with a case of using a complicated link mechanism or the like, there is achieved an advantage that a total mechanism is simplified and a degree of freedom of an apparatus layout is high.

Further, by constituting the second unit 2b attachable and detachable to and; from the first unit 2a including the motor 5 and the driver unit 16 constituting the drive system of the tape feeder 1, an interchanging operation can be carried out by separating only the second unit 2b when the tape is interchanged in a case of out of parts. The second unit 2b which does not include the drive system is easy to deal with, and therefore, an operability thereof is excellent, further, after interchanging the tape, the second unit 2b is only mounted to the first unit 2a which has already been set up, and therefore, an operating time period required for interchanging the tape can be shortened. Further, the second unit 2b which does not include the drive system can be fabricated by comparatively inexpensive cost, and therefore, the interchanging time period can further be shortened by preparing a plurality of pieces thereof for one piece of the tape feeder and bringing the second unit 2b into a state of being previously set with a tape for interchange.

Figure 5:
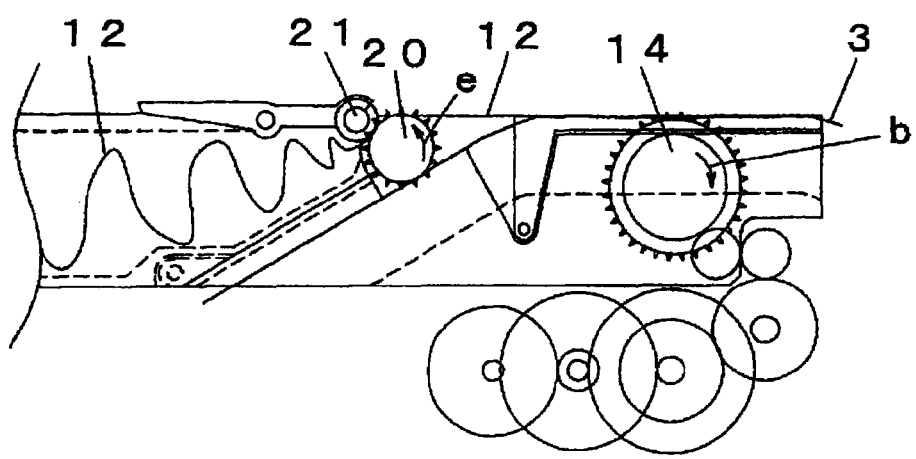
FIG. 5 is a side view of a tape feeder according to other embodiment of the invention.

Further, according to the tape feeder of the embodiment, as shown by FIG. 5, a driven sprocket 20 can be arranged to be brought in mesh with the carrier tape 3 from an upper side thereof to achieve a function of an exfoliating roller. In FIG. 4(b), when the driven sprocket 6 is arranged to be brought in mesh with the carrier tape 3 from a side the same as that of the carrying sprocket 4, that is, from a lower side of the carrier tape 3, the driven sprocket 6 is rotated in a direction the same as that of the carrying sprocket 4 (refer to arrow marks b, d), and therefore, in order to rotate the exfoliating roller 7 in a reverse direction (refer to arrow mark c), an even number of pieces of the middle gears 15 need to be interposed therebetween. The exfoliating roller 7 is arranged on an upper side of the carrier tape 3, that is, by pinching the carrier tape 3 along with the driven sprocket 6, and therefore, there is brought about a portion A overlapping the middle gear 15 and the carrier tape 3 each other in a width direction of the tape feeder. Therefore, it is necessary to take a measure of arranging the middle gear 15 to escape in the width direction of the carrier tape 3 so as not interfere therewith, which constitutes a restriction in view of layout.

In FIG. 5, the driven sprocket 20 arranged on the upper side of the carrier tape 3 is driven to rotate (arrow mark e) by the movement of the carrier tape 3 carried from the upstream side to the downstream side, and reels the cover tape 12 between the driven sprocket 20 and an opposed exfoliating roller 21 to exfoliate from the upper face of the carrier tape 3. By dispensing with the middle gear in the exfoliating mechanism of the cover tape in this way, there is achieved an advantage of promoting a degree of freedom of an apparatus layout in a transverse direction (width direction of the tape feeder).

INDUSTRIAL APPLICABILITY

According to the invention, the carrier tape can be carried and the cover tape can be exfoliated by the single b drive system without using a link mechanism, and therefore, there is achieved an advantage that the tape feeder can be fabricated by comparatively inexpensive cost and the degree of freedom of the apparatus layout is promoted by simplifying a total mechanism, which is useful in a field of continuously mounting a part of a semiconductor chip or the like onto a board.

The invention claimed is:

1. A tape feeder comprising:
   a first unit comprising:
      a carrying sprocket which is rotatable in a state of being brought in mesh with a sprocket hole formed at a carrier tape; and
      driving means for driving the carrying sprocket to rotate;
   a second unit made to be attachable and detachable to and from the first unit and comprising:
      a driven sprocket driven by the driving means through the carrying sprocket and the carrier tape as being brought in mesh with the sprocket hole of the carrier tape carried in one direction by the rotation of the carrying sprocket; and
      an exfoliating roller rotated cooperatively with the driven sprocket for reeling to exfoliate a cover tape pasted onto the carrier tape for sealing a part; and
   restricting means for restricting a position of the carrier tape when the second unit is detached from the first unit and for releasing the restriction of the position of the carrier tape when the second unit is attached to the first unit.

2. The tape feeder according to claim 1, wherein the carrying sprocket is brought in mesh with the sprocket hole from a lower side of the carrier tape and the driven sprocket is brought in mesh with the sprocket hole from an upper side of the carrier tape.

3. The tape feeder according to claim 1, wherein the carrying sprocket, the driven sprocket and the exfoliating roller are driven by a single driving system constituted by the driving means.

4. The tape feeder according to claim 1, wherein the attachment of the second unit to the first unit changes a position of the restricting means, and the change of the position of the restricting means releases the restriction of the position of the carrier tape.

5. The tape feeder according to claim 4, wherein the restricting means is provided with a switch that brings the change of the position of the restricting means when the second unit is mounted to the first unit.

6. The tape feeder according to claim 5, wherein the switch is arranged at a position of interfering with the first unit and the second unit in mounting the second unit to the first unit.

7. The tape feeder according to claim 6, wherein the second unit is provided with the switch.

* * * * *